United States Patent [19]

Gupta et al.

[11] Patent Number: 4,751,723
[45] Date of Patent: Jun. 14, 1988

[54] MULTIPLE VACUUM ARC DERIVED PLASMA PINCH X-RAY SOURCE

[75] Inventors: Rajendra P. Gupta, Gloucester; Mladen M. Kekez, Ottawa; John H. Lau; Gary D. Lougheed, both of Gloucester, all of Canada

[73] Assignee: Canadian Patents and Development Ltd., Ottawa, Canada

[21] Appl. No.: 910,535

[22] Filed: Sep. 23, 1986

[30] Foreign Application Priority Data

Oct. 3, 1985 [CA] Canada ................... 492227

[51] Int. Cl.⁴ ........................................... H01J 35/00
[52] U.S. Cl. ................... 378/119; 378/121; 378/122
[58] Field of Search ............... 378/119, 122, 121

[56] References Cited

U.S. PATENT DOCUMENTS

| | | | |
|---|---|---|---|
| 4,184,078 | 1/1980 | Nagel et al. | 250/492 A |
| 4,201,921 | 5/1980 | McCorkle | 378/122 |
| 4,504,964 | 3/1985 | Cartz et al. | 378/119 |
| 4,536,884 | 8/1985 | Weiss et al. | 378/119 |
| 4,602,376 | 7/1986 | Doucet et al. | 378/119 |
| 4,618,971 | 10/1986 | Weiss et al. | 378/119 |
| 4,633,492 | 12/1986 | Weiss et al. | 378/119 |

FOREIGN PATENT DOCUMENTS 0154200 9/1983 Japan ................... 378/119

Primary Examiner—Janice A. Howell
Assistant Examiner—David P. Porta
Attorney, Agent, or Firm—Yoshiharu Toyooka

[57] ABSTRACT

With the intent of satisfying the requirement of x-ray lithography a plasma pinch x-ray source has been developed in which the initial plasma annulus is derived from a plurality of electrical arcs in vacuum. This gives a low mass liner for the standard imploding plasma liner configuration to emit suitable x-rays and has the capability of being fired at repetition rates of 10 pps or more. The simplicity of this source design is especially attractive for a commercial use environment.

11 Claims, 1 Drawing Sheet

MULTIPLE VACUUM ARC DERIVED PLASMA PINCH X-RAY SOURCE

TECHNICAL FIELD

The invention relates to an x-ray source suitable for commercial submicron lithography on semiconductors for making dense large scale integrated circuits.

BACKGROUND

The invention relates to making an x-ray source suitable for submicron lithography of semiconductors in commercial quantities. The technical specification of such a source can be derived from a research paper "Intense Pulsed Plasma X-Ray Source for Lithography: Mask Damage Effects" published by H. A. Hyman et al. in the Journal of Vacuum Science Vol. 21, pp. 1012–1016 (1982). Essentially it requires that in order to avoid mask thermal damage a source with small size, high conversion efficiency of electrical energy into x-rays about 1 keV and x-ray emission during the required exposure time to be continuous or distributed over several small pulses rather than concentrated in one strong pulse.

The common most x-ray source is the electron impact type source in which electrons are accelerated by an electric field to impinge on a metal target. The electrical to x-ray energy conversion efficiency of such a source is so low that heat dissipation in an acceptable lithography source presents an insurmountable problem.

In another type of x-ray source, as shown by Nagel et al. U.S. Pat. No. 4,184,078, Jan. 15, 1980, a high power pulsed laser beam strikes a solid target to form dense plasma which emits x-rays for a very short duration. The laser required for such a source is very bulky and expensive and not economical to operate at a repetition rate desired for commercial x-ray lithography.

In yet another type of x-ray source, a gas is puffed between a pair of electrodes to form an annulus, and a capacitor bank discharged between the electrodes through the gas annulus, which then carries high current and as a result implodes on its axis. The implosion, being driven by the energy stored in the capacitor bank, forms a hot and dense plasma column causing x-ray emission. The main limitation of the device is the low repetition rate due mainly to the time required to pump down the puffed gas.

In yet another type of x-ray source, as shown by Cartz et al. U.S. Pat. No. 4,504,964, Mar. 12, 1985, high power pulsed laser beams are used to produce an annulus of material between two electrodes through which a high current is passed by discharging a capacitor bank. This causes the material to implode on the axis of the annulus, forming dense hot plasma which is then a pulsed source of x-rays. The use of a high power laser makes the device bulky and very expensive.

There are other types of imploding plasma x-ray sources developed for research such as the exploding wire array and the thin foil annulus, but these require replacement of imploding material after each shot and thus are usable for commercial x-ray lithography.

As has been shown by McCorkle U.S. Pat. No. 4,201,921, May 6, 1980, x-rays can be repeatedly produced by impinging an intense electron beam on a plasma generated by passing a high current along the inner wall of an insulator capillary. One of the problems with such a source is that the capillary needs to be replaced after several shots.

SUMMARY OF THE PRESENT INVENTION

The present invention provides a simple, low cost means of repeatedly producing intense x-rays such as for submicron lithography for making densely packed integrated circuits. The invention provides the formation of material plasma annulus between a pair of electrodes by firing a plurality of vacuum electrical arcs, and x-ray generation by way of pinching the plasma by passing high current through it.

DETAILED DESCRIPTION OF THE PREFERRED EMBODIMENTS

Figure 1:
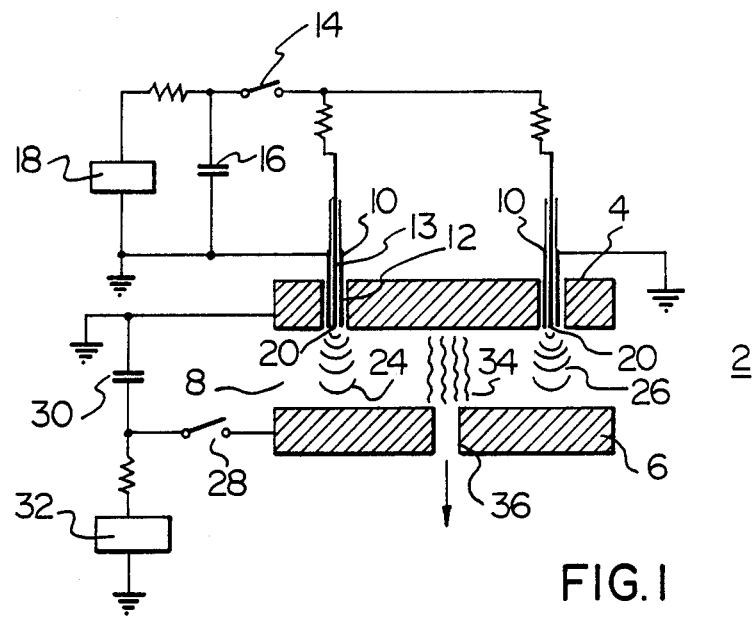
FIG. 1 is a schematic display of the x-ray device in accordance with the invention.
Figure 2:
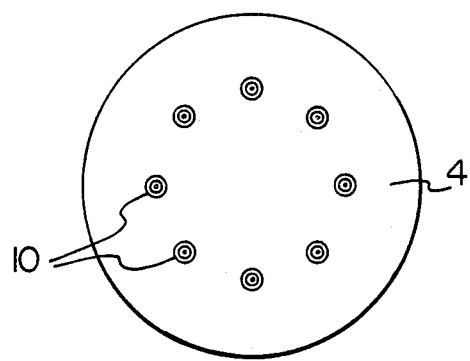
FIG. 2 is a schematic view of the multiple vacuum arc electrodes in the embodiment shown in FIG. 1.

The x-ray device 2 in FIGS. 1 and 2 comprises of a pair of circular electrodes 4 and 6 separated with a vacuum space 8. Electrode 4 is provided with a multiplicity of vacuum arc electrodes 10. Each of the vacuum arc electrodes is made, in this embodiment, a tubular arcing electrode 12 and a central arcing electrode 13, the latter being coaxial with the former. A high voltage is applied in pulses across the arcing electrodes of the vacuum arc electrodes by closing switch 14 which discharges through the arcs, a capacitor 16 charged by a power supply 18. The vacuum arc electrodes may have vacuum all around the arcing regions or an insulator surface in contact with the arcing electrodes or the like arrangement to assist in a good arc formation and controlled erosion of material from the electrodes, insulator or the like. The arcing electrodes can be made of Al, Mg or other suitable metals. The eroded material is in the form of plasma plumes such as 24 and 26 bridging the space 8 between the circular electrodes 4 and 6.

The closing of the switch 14 is followed by closing of switch 28 to discharge a capacitor 30 which is charged by a power supply 32. This causes a transient high current to flow through the plasma annulus formed by the expanding plasma plumes in space 8 and the resulting high magnetic field implodes the plasma to form a pinch 34. The pinched plasma 34 is hot and dense enough to radiate x-rays. The x-rays for lithography and the like uses leave the device through axial passage shown as a hole 36 in the electrode 6. Alternately, the x-rays may be emitted out radially or at an angle through the circular electrodes by providing appropriate passages.

In an alternate arrangement of the device different vacuum arc electrodes are driven independently in parallel with separate capacitors. In another arrangement the vacuum arc electrodes are drawn in series with a single capacitor. It is also possible to have the vacuum arc electrodes fire in a series-parallel combination.

The present x-ray device provides an unlimited selection of material for generating plasma, thus enabling generation of x-rays of the desired type. The high repeatability rate e.g. 10 pulse per second and higher of the device are complementary to a manufacturing environment.

The details of the pulsed plasma x-ray source described herein, as well as the variations suggested thereof, are only illustrative and are not intended to limit the spirit or scope of the invention set forth in the appended claims.

We claim as our invention:

1. A method of producing repeatedly pulsed x-rays, comprising steps of generating plasma annulus between two mutually parallel electrodes by way of electrode erosion in a multiplicity of vacuum electrical arcs, and generating repeatedly pulsed x-rays by imploding and pinching the said plasma annulus on its axis under the magnetic pressure created by passing high axial current through the said plasma annulus between the said two electrodes.

2. The method of producing repeatedly pulsed x-rays as defined in claim 1, wherein
    the step of generating plasma annulus comprises a step of
    discharging repeatedly an electrical current via a plurality of arcing electrodes arranged in a predetermined pattern to generate the multiplicity of the vacuum electrical arcs.

3. The method of producing repeatedly pulsed x-rays as defined in claim 2 further comprising a step of
    withdrawing x-rays through a passage provided in one of the two electrodes.

4. An apparatus for producing repeatedly pulsed x-rays comprising:
    a pair of electrodes being spaced apart from each other and forming a space therebetween,
    means for generating plasma annulus in the said space by way of electrode erosion in a multiplicity of vacuum electrical arcs, and
    means for generating repeatedly pulsed x-rays by imploding and pinching the said plasma annulus on its axis under the magnetic pressure created by passing high axial electrical current through the said plasma annulus between the said two electrodes.

5. An apparatus for producing repeatedly pulsed x-rays according to claim 4 wherein:
    the said means for generating plasma annulus includes a plurality of vacuum arc electrodes arranged in a predetermined pattern for repeatedly generating a plasma annulus in the said space, and
    the said means for generating repeatedly pulsed x-rays includes current means for repeatedly passing the said high electrical current through the said plasma annulus betwen the said electrodes.

6. The apparatus for producing repeatedly pulsed x-rays as defined in claim 5 further comprising:
    passage means communicating with the said space for withdrawing x-rays thus produced from the said space.

7. The apparatus for producing repeatedly pulsed x-rays as defined in claim 6, wherein:
    the said plurality of the vacuum arc electrodes are provided in one of the pair of the electrodes and arranged mutually equidistantly in a circle; and
    each of the said vacuum arc electrodes comprises a tubular electrode and a central electrode coaxial with the former at least one of the tubular electrode and the central electrode being made of a metal selected from a group consisting of Al and Mg.

8. The apparatus for producing repeatedly pulsed x-rays as defined in claim 7, wherein:
    the said passage means are provided in the form of a hole in at leaset one of the said pair of the electrodes.

9. An apparatus for producing repeatedly pulsed x-rays according to claim 6 wherein a plurality of vacuum arc electrodes are provided in one of the parallel electrodes and arranged mutually equidistantly in a circle, and the apparatus further comprising
    arcing means for repeatedly energizing the said vacuum arc electrodes to generate in the said space a plasma annulus.

10. The apparatus for producing repeatedly pulsed x-rays as defined in claim 9, wherein:
    each of the said vacuum arc electrodes comprises a tubular electrode and a central electrode coaxial with the former, at least one of the tubular electrode and the central electrode being made of a metal selected from a group consisting of Al and Mg.

11. The apparatus for producing repeatedly pulsed x-rays as defined in claim 10, wherein
    the said passage means are provided in the form of a hole in at least one of the said pair of the electrodes.

* * * * *